US007566875B2

(12) United States Patent
Starikov et al.

(10) Patent No.: US 7,566,875 B2
(45) Date of Patent: Jul. 28, 2009

(54) SINGLE-CHIP MONOLITHIC DUAL-BAND VISIBLE- OR SOLAR-BLIND PHOTODETECTOR

(75) Inventors: David Starikov, Houston, TX (US); Abdelhak Bensaoula, Houston, TX (US)

(73) Assignee: Integrated Micro Sensors Inc., Houston, TX (US)

( * ) Notice: Subject to any disclaimer, the term of this patent is extended or adjusted under 35 U.S.C. 154(b) by 13 days.

(21) Appl. No.: 12/051,399

(22) Filed: Mar. 19, 2008

(65) Prior Publication Data
US 2008/0157253 A1    Jul. 3, 2008

Related U.S. Application Data

(63) Continuation-in-part of application No. 11/403,691, filed on Apr. 13, 2006, now Pat. No. 7,381,966.

(51) Int. Cl.
*G01J 5/20* (2006.01)
*H01L 27/14* (2006.01)

(52) U.S. Cl. ............... 250/338.4; 250/372; 250/370.01

(58) Field of Classification Search .............. 250/338.4, 250/372, 370.01
See application file for complete search history.

(56) References Cited

U.S. PATENT DOCUMENTS

| 4,000,502 A | * | 12/1976 | Butler et al. ................. 257/453 |
| H000101 H | * | 8/1986 | Walker .................... 250/338.1 |
| 2004/0097021 A1 | * | 5/2004 | Augusto et al. ............. 438/149 |

* cited by examiner

*Primary Examiner*—David P Porta
*Assistant Examiner*—Jessica L Eley
(74) *Attorney, Agent, or Firm*—Claude E. Cooke, Jr.; Burleson Cooke L.L.P.

(57) ABSTRACT

A photodetector having sensitivity in a wide temperature range in both an infrared and an ultraviolet band is provided. The photodetector is formed on a single chip and is designed to be blind to solar or visible radiation. Structures disclosed allow fast and efficient detection of signals with high spatial and temporal resolution. Such sensors may be used for multi-pixel focal arrays and applied for fire detection applications, various space- and military-related applications and other applications. A method for increasing rejection of visible light by the IR sensitive material is also provided.

7 Claims, 10 Drawing Sheets

US 7,566,875 B2

SINGLE-CHIP MONOLITHIC DUAL-BAND VISIBLE- OR SOLAR-BLIND PHOTODETECTOR

This is a continuation-in-part application of application Ser. No. 11/403,691, filed Apr. 13, 2006

BACKGROUND OF THE INVENTION

1. Field of the Invention

The present invention relates to monolithic visible- or solar-blind photodetectors with resolved sensitivities in the UV and IR bands. Methods for fabrication of the photodetectors and a method for decreasing sensitivity of the integrated structure to visible or solar radiation are also provided.

2. Description of Related Art

Solid-state optical detectors based on semiconductor materials have replaced photoemissive devices in a wide variety of both commercial and military applications due to their broad spectral responsivity, excellent linearity, high quantum efficiency, high dynamic range of operation, and possibility of large-format image arrays. The spectral range of most semiconductor-based optical detectors is determined by optical absorption in the active semiconductor material layer at energies above the semiconductor band gap, the cutoff wavelength. In such terms narrow-band gap semiconductors, such as II-VI compounds like HgCdTe, are suitable for infrared detection, Si and some III-V compounds are suitable for detection in the visible and near infrared range, and wide band gap semiconductor materials, such as diamond, SiC, and III-Nitrides, are superior for applications in the UV range.

Several military and industrial applications require simultaneous (or at least spatially synchronized) detection of optical emissions in different spectral regions. A large number of various objects, such as, for example, fires, jet or rocket nozzles, hot filaments, stellar luminaries, electrical arcs, and lightning produce optical emissions ranging from ultraviolet to IR. Such emissions can be detected over the wide-range of ambient light background only by fast multi-range optical detectors allowing time-resolved measurements in particular optical bands. As a result, not only the spectral range, but also the detector speed and spatial resolution and alignment become critical for fast fire-detection with high false-alarm immunity. Currently used photomultiplier tubes (PMTs) have high sensitivity, but are bulky, require high voltage operation, and have low mechanical and temperature strength. Some recently developed flame detectors are composed of discrete UV and IR solid-state components in one housing, but these devices sustain temperatures only up to 125° C., and are not capable of detecting multi-band optical signals with high spatial resolution.

To date significant progress has been made in the development of UV detectors based on wide band gap materials. Several attempts to develop UV detector structures on diamond were made by 1996, but lack of high quality layers and insufficient doping levels did not result in practical devices. Visible-blind UV photodetectors have been fabricated on silicon carbide (SiC) substrates, but the technology is relatively immature due to the absence of high quality large area substrates until recent years.

Group III-nitride materials are superior for advanced UV detector fabrication due to their wider direct band gap and high thermal, chemical, mechanical, and radiation tolerance. A large amount of research by several groups has been dedicated to the development of UV detectors based on GaN, GaN/AlGaN, and AlGaN. Currently attracting most interest are AlGaN-based structures since they can provide detection in the very important UV range of 240-280 nm, which corresponds to the optical window where solar radiation is significantly absorbed by the ozone layer. Research and development performed by several groups indicate that effective optical emission and detection can be achieved in a wide spectral band ranging from 200 to 1770 nm. This would allow integrated nitride only-based devices working in separate bands (including UV and IR) for the entire referenced range.

In the area of IR detection, the conventional HgCdTe- and InSb-based detectors display high quantum efficiencies but are difficult to integrate into large arrays. Detectors based on heterointernal photoemission (HIP) in $Ge_xSi_{1-x}/Si$ heterojunctions have demonstrated excellent opportunities for integration on Si wafers at sufficient sensitivities in the infrared range of 1-12 µm. Large area SiGe-based HIP photodetector arrays of 400×400 pixels have been available for close to ten years. Schottky barrier photodetectors based on metal silicides formed on silicon also allow extending the sensitivity to the longer IR (>than 1.1 µm) range.

The Radio Frequency Molecular Beam Epitaxy (RF MBE) method used for nitride material growth allows fabrication of multilayer structures that incorporate binary, ternary, or even quaternary nitride compounds with a precise control over the layer thickness, chemical composition, crystalline quality, and doping during a single-process growth on commercial sapphire or silicon substrates. Growth of III nitrides on Si wafers takes advantage of both the commercial and technological benefits offered by the well-commercialized silicon technology and the existing low cost electronic and optical IR devices. Device-quality GaN layers grown on silicon wafers have been demonstrated by several groups. Additional benefits for employment of silicon in the present invention come from its optical properties providing the ability to detect and block optical emissions in the near IR and visible ranges, respectively.

A multi-spectral infrared photodetector and imager is disclosed in U.S. Pat. No. 6,897,447 B2. Two or more different bands of IR radiation are detected by a diffractive resonant optical cavity. U.S. Pat. No. 6,049,116 also teaches a device and fabrication method for a two-color IR detector What is needed is a miniature, chip-based dual-color high-temperature visible- or solar-blind photodetector that will allow for fast and efficient detection of optical emission in UV and IR bands using sensors in close proximity, so as to produce high spatial- and temporal-resolution signals over a wide range of operating temperatures. Such sensors should allow fabrication of multi-pixel focal arrays for dual-band visible- or solar-blind cameras, which can be used not only for fire/flame detection and imaging, but also for various space- and military-related applications that involve object/target recognition.

SUMMARY OF INVENTION

This invention describes a monolithic single-chip dual-band solar- or visible-blind photodetector with resolved sensitivities in UV and IR bands. The active semiconductor layers used as UV and IR detectors may be stacked or interlaced. Stacked layers may be formed using standard methods of fabrication. A method for fabrication of interlaced semiconductor layers is disclosed in the parent application, U.S. Pat. App. Pub. No. US 2007/0241279, filed Apr. 13, 2006, now U.S. Pat. No. 7,381,966, which is incorporated by reference herein. A layer that is opaque to visible or solar radiation (or both) may be provided in the stacked embodiment, or if an opaque substrate is used, this opaque layer may be omitted. In the presented embodiment, a silicon substrate serves as a layer for the IR detector structure fabrication, a filter for blocking visible or solar radiation and a compatible substrate for growth of III nitride layers providing for UV sensitivity.

DETAILED DESCRIPTION

Figure 3:
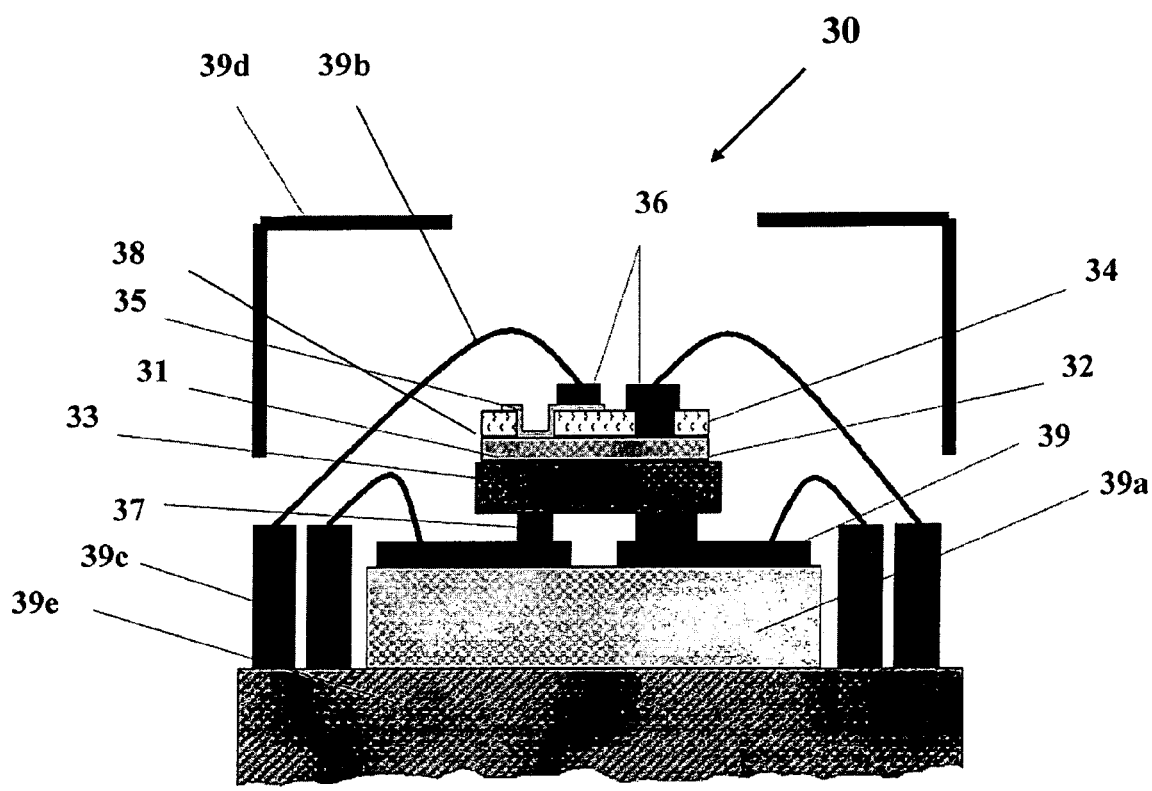
FIG. 3 is a schematic drawing of the single chip monolithic dual band visible-blind UV/IR photodetector.

The device disclosed herein meets the following basic requirements:

1) two photosensitive structures are stacked on a single substrate to form a monolithic photodetector;
2) one structure is sensitive to radiation in a UV band and the second structure is sensitive to radiation in an IR band;
3) The UV sensitive area on the front side of the photodetector is vertically aligned with the IR sensitive area on the back side of the photodetector, as shown in FIG. 3.
3) the monolithic photodetector is insensitive to solar or visible radiation;
4) the monolithic photodetector is capable of time- and electrically-resolved detection of both UV and IR radiation in the same space register;
5) the two active semiconductor layers and contacts used as photosensitive structures as well as the passive semiconductor layer to filter out the visible or solar radiation, are stacked on a single substrate in one embodiment;
6) the photosensitive structures are either diodes (Schottky, p-n, p-i-n, multi-quantum well junctions) or photoresistors formed by deposition of contacts on active semiconductor layers; and
7) the device can have additional layers also stacked on the substrate that are necessary for the growth of the semiconductor layers (for example buffer layers) or to provide electrical isolation between other layers (for example silicon dioxide). These additional layers have negligible effect on the optical transmission of the whole stacked monolithic device structure.

DEFINITIONS

1. A substrate is a wafer suitable for the growth and deposition of active and passive semiconductor and contact layers. A substrate can be also transparent to IR radiation and can be opaque to visible radiation.
2. Active semiconductor layers are layers of semiconducting materials that are used for fabrication of UV- and IR-sensitive structures.
3. UV- and IR-sensitive structures are fabricated by using active semiconductor layers and contacts.
4. Passive semiconductor layers are layers opaque to visible or solar radiation that can be deposited on the substrate or be a part of the substrate.
5. Reverse bias applied to a Schottky diode structure based on an n-type semiconductor means a positive electrical potential applied to the Ohmic contact and a negative electrical potential applied to the Schottky contact. Forward bias applied to a Schottky diode structure based on an n-type semiconductor means a negative electrical potential applied to the Ohmic contact and a positive electrical potential applied to the Schottky contact.
6. Reverse bias applied to a Schottky diode structure based on a p-type semiconductor means a negative electrical potential applied to the Ohmic contact and a positive electrical potential applied to the Schottky contact. Forward bias applied to a Schottky diode structure based on a p-type semiconductor means a positive electrical potential applied to the Ohmic contact and a negative electrical potential applied to the Schottky contact.

The layouts described herein are shown for a monolithic photodetector having a single pixel. However, each of the layouts can be implemented in a multi-pixel (array) design. Such designs are necessary in order to enable space sensitive light measurements (e.g. imaging). In this case the geometry of the staked layers and the substrate should satisfy conditions that provide for minimum cross-talk between the neighboring pixels.

Figure 1:
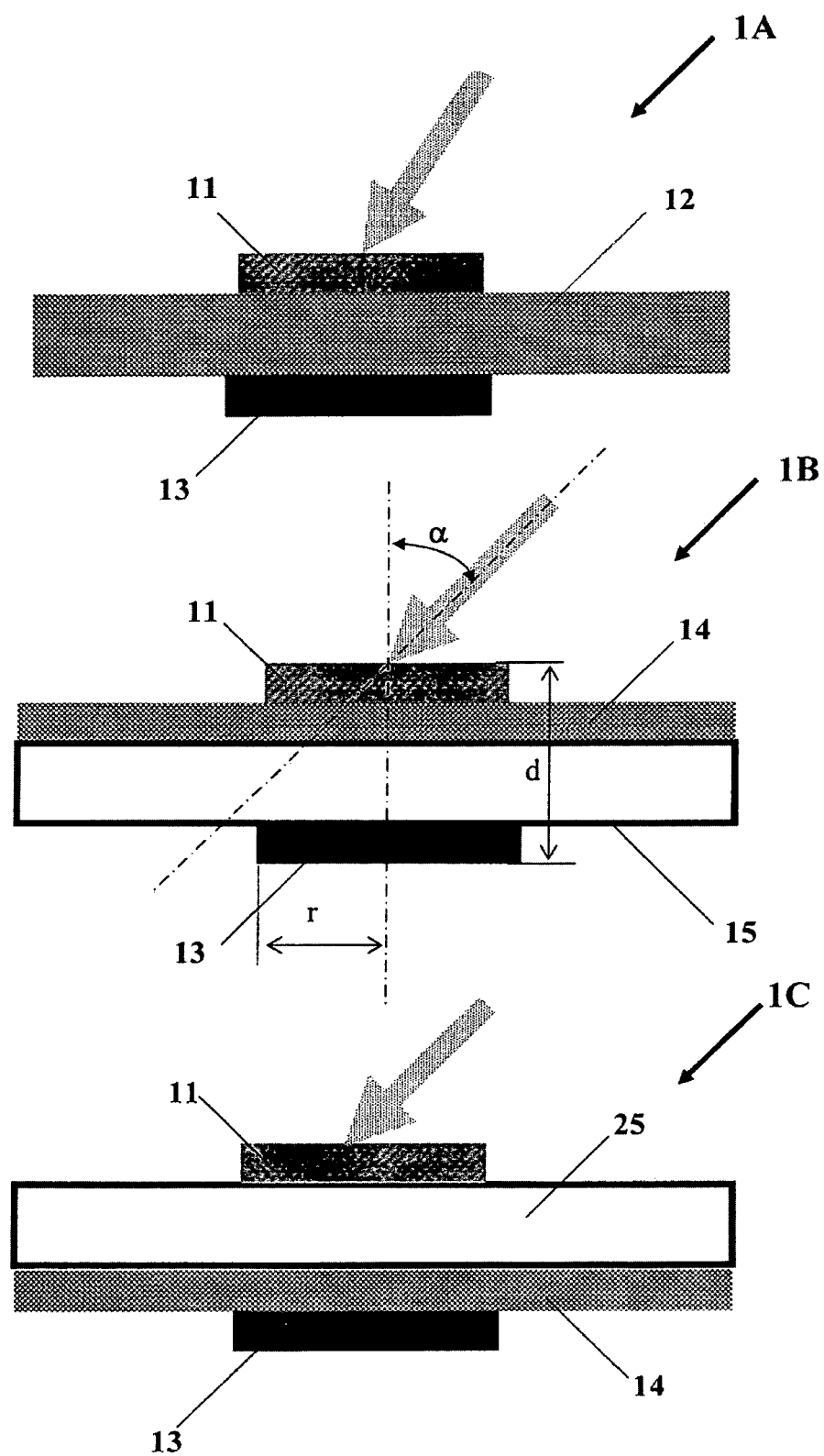
FIG. 1A illustrates the use of the substrate as a filter layer.
FIG. 1B illustrates a filter layer between an optically transparent substrate and a UV sensitive active area.
FIG. 1C illustrates a filter layer between an optically transparent substrate and IR sensitive active area

FIG. 1 shows layouts based on employment of a semiconductor material that exhibits intrinsic fundamental optical absorption in the solar or visible range of the spectrum and can be simply integrated into the design of a single chip monolithic dual-band UV/IR photodetector. FIG. 1A shows a layout that incorporates UV-sensitive layer 11 formed on the top of semiconductor substrate 12, which is also capable of filtering out solar or visible radiation, and IR-sensitive layer 13 formed on the bottom of the substrate-filter 12. FIG. 1B describes a layout that incorporates semiconductor layer 24 as a filter for the visible or solar radiation. Filter layer 14 will be formed between the surface of the photodetector exposed to incident light and the IR-sensitive active area 13, but it may be contiguous with either surface of transparent substrate 15, as illustrated in FIGS. 1B and 1C. As shown in FIG. 1B, the third basic requirement can be satisfied through adjustments between the thickness of each layer and substrate, dimensions of the active areas, and the radiation incident angle. The thicker are the substrates and the layers, the smaller are the active areas, the smaller radiation incident angles can satisfy the third basic requirement. In general, the α incident angle can be roughly estimated from the following equation:

$$tg(\alpha) = r/d \qquad \text{(Eq. 1)}$$

where α is the incident angle, r is the half dimension of the bottom active area and d is the total thickness of the whole photodetector structure.

In one embodiment of the single chip integrated dual-band (UV/IR) photodetector with resolved sensitivity in each band, a silicon substrate is used. Referring to the device layout shown in FIG. 1A, two photosensitive structures—one sensitive in the UV part of the spectrum and another sensitive in the IR part of the spectrum—are formed on a III nitride-based material and silicon (Si), respectively. The substrate may be <111> Si, which is generally accepted as preferred orientation for III nitride material growth.

The general growth process for the III nitride growth by, for example Radio Frequency Molecular Beam Epitaxy (RF MBE) is as follows: prior to growth the substrates are cleaned by standard solvent degreasing, acid etching, and a DI water rinse. They are then quickly loaded into the introduction chamber attached to the MBE chamber, pumped down below $1 \times 10^{-6}$ torr, and then transferred into the MBE chamber. Before initiating film deposition, the substrates are degassed at 850° C. and then the temperature is lowered to the growth temperature, typically between 750-825° C. for GaN, AlN, and AlGaN and 500-650° C. for InGaN and InN. AlN buffer layers are deposited at a high (>800° C.) temperature on both $Al_2O_3$ (sapphire) and Si substrates before deposition of GaN or/and its alloys.

The III nitride layer structure consists of a GaN or AlGaN layer (each of >200 Å thickness). The IR-sensitive photodetector structure is formed directly on the back side of the Si surface.

Both UV-sensitive and IR-sensitive photodetector structures can be either photoresistor (photoconductor) or photodiode-type. In the case of using the photoresistor type, Ohmic contacts should be used on both sides of each of the active semiconductor material area. In the case of using the photodiode type, the active contacts should be transparent to the respective wavelengths (UV or IR) and can be made of thin (<200Å) metal (Au is preferred because of the lowest resistivity) layers or conductive metal oxide semiconductor films ($SnO_2$ or ITO) deposited on p-n junctions, p-i-n junctions, or Schottky barriers. The Ohmic contacts should be made of metals that have a large work function if deposited on p-type semiconductor layers, and small work function if deposited on n-type semiconductor layers, or any other metals or their combinations generally accepted for Ohmic contacts to Si and III nitrides.

A standard <111> orientation silicon substrate is used to realize the layouts shown in FIG. 1A. In this case the UV- and IR-sensitive photodetector structures are formed on the front and on the back of the Si substrate, respectively. The UV-sensitive structure is formed from the III nitride layer structure grown and on the front of Si. Then an IR-sensitive photodetector structure with an active area vertically aligned (FIG. 3) with the active area of the UV-sensitive photodetector structure is formed on the backside of the Si substrate. In this layout a round (or at least square) shape for the active areas is preferred, since it provides for most efficient and uniform transfer of the electrical charge generated or being controlled on the photodetector structure contacts.

Figure 2:
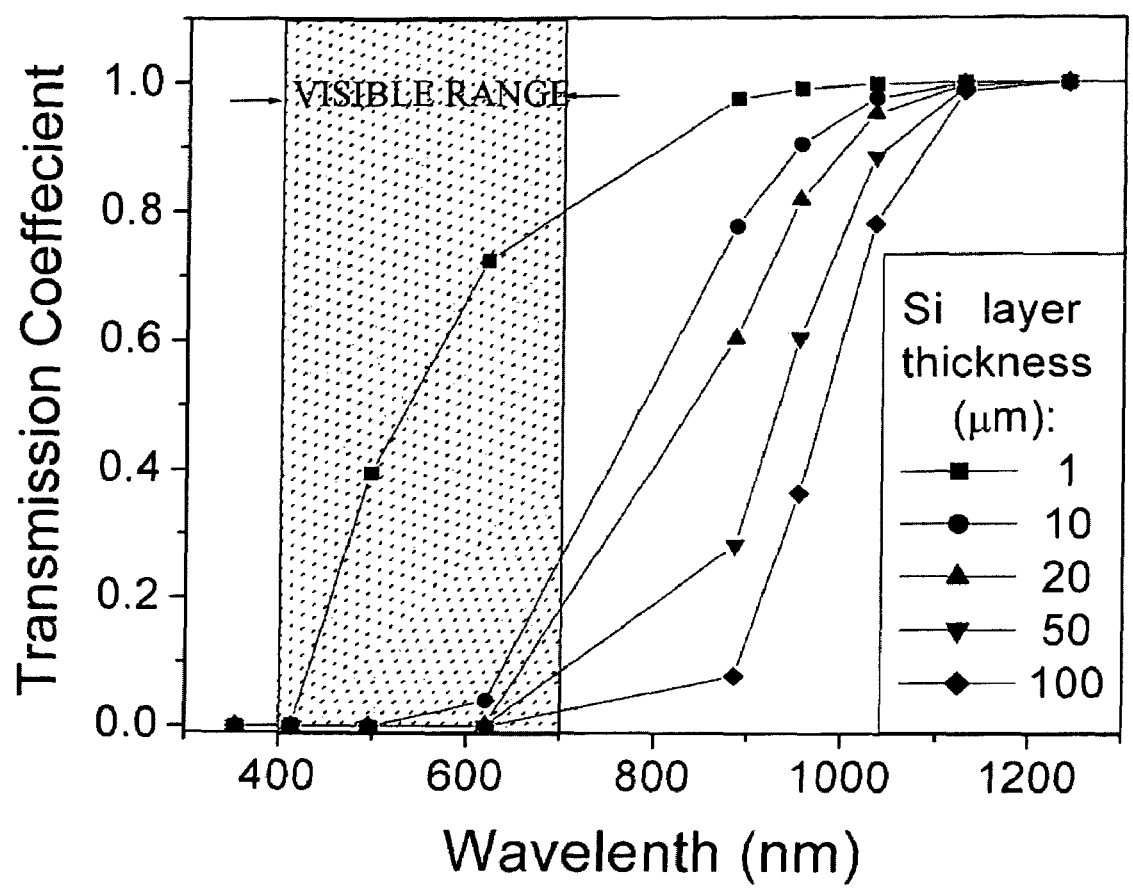
FIG. 2 shows the wavelength dependence of optical transmission of silicon layers having different thicknesses.

In this layout the Si substrate may serve as a filter blocking the solar- or visible radiation. The plots in FIG. 2 show the wavelength-dependence of the absorption coefficient for five different values of the silicon layer thickness. From the plots it can be seen that 10 μm and 20 μm thick Si layers transmit less than 30% and 20% of radiation, respectively, at a wavelength of 700 nm, which is generally accepted as a short pass cutoff for visible radiation. A 100 μm thick Si layer transmits less than 5% of the radiation at 700 nm and less than 10% of radiation at 900 nm. Depending on the photodetector application, employment of thinner (10-20 μm), or thicker (100-200 μm) Si layers can be beneficial.

Employment of silicon for detection in the near infrared range from 700 to 1100 nm allows operation of the photodiode in a temperature range from −60° C. up to 125° C., which is the temperature range allowed for most of the Si-based devices. In contrast, all the infrared detectors based on the narrow band semiconductors work at temperatures below room temperature.

The layout illustrated in FIG. 1A was realized in a device schematically shown in FIG. 3. Packaged monolithic photodetector 30 includes thick intrinsically n-type GaN layer 31 deposited on top of a buffer AlN layer 32 grown on n-type <111> Si wafer 33 having a thickness of 150 μm. In this device, a GaN layer was used to provide the UV sensitivity in the range below 365 nm. A ~2 μm thick silicon dioxide dielectric layer 34 was deposited and patterned in order to prevent leakage by using areas of exposed GaN surrounded by an insulating layer. Semitransparent (<100 Å thick) Au layer 35 was deposited through a stencil mask with 1 mm diameter windows in such a way that half of the semitransparent gold contact area is located on the exposed GaN areas, while the other half is located on top of silicon dioxide insulating layer 34. Thick Ti (2000Å)/Au (2000Å) contacts 36 were then deposited on top of the semitransparent Au contacts located on the silicon dioxide layer and as Ohmic contacts to GaN. The device was further processed by depositing Pt contacts 37 on n-type silicon on the backside of wafer 33 and a thin (~50 Å) silicon dioxide layer 38 in order to promote higher potential barrier height on the GaN. A standard TO-8 housing was used for packaging. Pt contacts 37 on the backside of the silicon chip were bonded by using the high-temperature conductive epoxy to Au pads 39 deposited and patterned on top of thermally-conductive electrically insulating AlN ceramic carrier plate 39a. Then the Au pads on the ceramic plate were micro-bonded by using a 30-μm thick Au wire 39b, with two of the TO-8 housing legs 39c, while the Ti/Au contacts on top of the chip were micro-bonded to the other two legs of the housing. A ~5 mm diameter opening was cut in the housing cap 39d. This cap was glued by a high-temperature epoxy to the housing base 39e.

Similar packaging procedures can be used for assembly of monolithic dual band photodetectors based on other layouts described herein.

Figure 4:
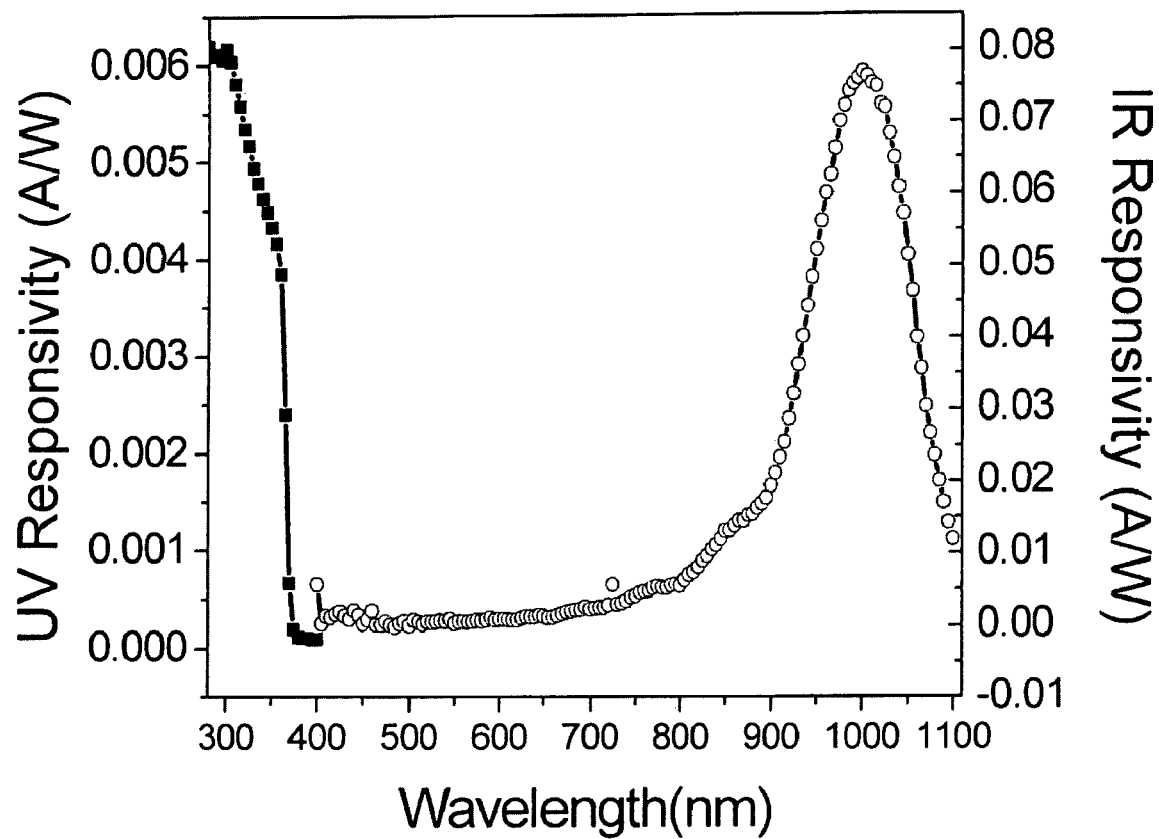
FIG. 4 shows the responsivity measured from the photodetector shown in FIG. 3.

The device responsivity measured in two different bands from the single-chip-integrated dual-band photodiode illustrated in FIG. 3 is shown in FIG. 4. The maximum peaks at ~350 nm and ~960 nm, correspond to the band edge absorption of GaN and Si, providing a visible-blind sensitivity in the near UV and near IR range, respectively.

Figure 5:
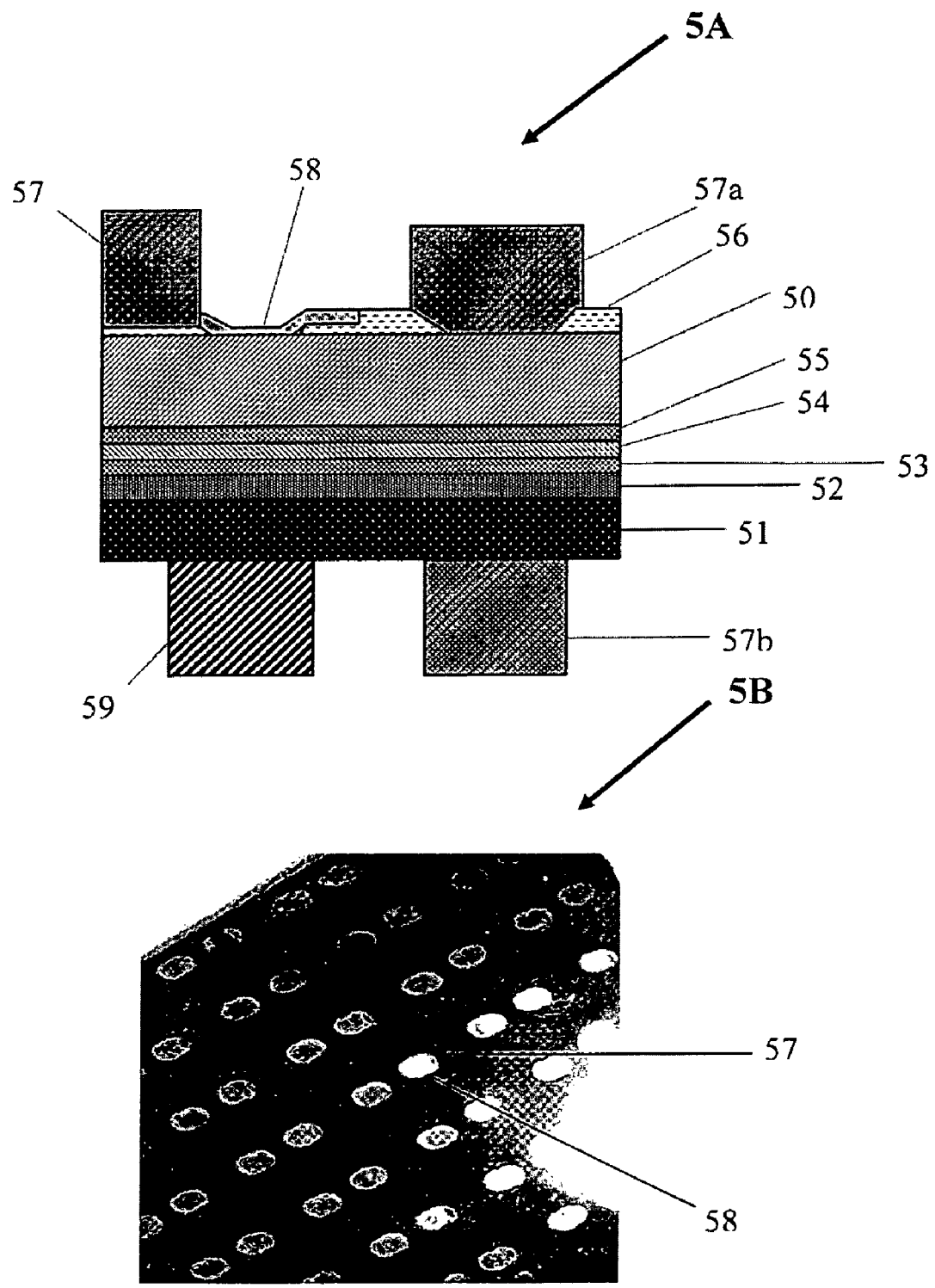
FIG. 5A is a schematic drawing of the single chip monolithic dual band solar-blind UV/IR photodetector.
FIG. 5B is a front surface image of the single chip monolithic dual band solar-blind UV/IR photodetector.

FIG. 5 shows a structure of an integrated UV/IR dual band solar-blind photodetector fabricated by using a AlGaN layer 50 instead of the GaN layer and an n-type silicon wafer 51 with a p-type doped layer 52 on the front side. Such modifications resulted in achievement of sensitivities in the UV range with a short pass cutoff wavelength in the range from 200 to 280 nm and reduction of the visible light background level.

For the fabrication of the photodiode structure shown in FIG. 5A, Si wafer 51 with a p-type layer 52 on the front side was loaded into the MBE chamber. First AlN buffer layer 53 was grown on the p-type Si<111> surface. Then growth of a 2500 Å thick i-AlGaN layer 54 and a 500 Å thick low temperature AlN layer 55 were grown in order to minimize defect density and termination of the vertical stack defects, which result in leakage currents that ultimately promote sensitivity to the visible light. Finally a thick 3000 Å n-AlGaN active semiconductor layer 50 was grown on the top of the substrate front side.

The diodes were fabricated by using an exchangeable stencil mask setup. First a 1 μm thick $SiO_2$ layer 56 was deposited on the AlGaN surface by PECVD. Then the oxide layer was processed by using photolithography to create rows of circular openings for Schottky and Ohmic contact fabrication. Transparent (100Å thick)~0.6 mm diameter Au dots 58 were deposited through a matching stencil mask to cover each opening etched in the silicon dioxide layer designated for the Schottky contact formation.

As also shown in FIG. 5B, by using a different stencil mask, ~0.3 mm diameter Ti/Au (400Å/3000Å) dots 57b were deposited to cover the openings in the oxide layer designated for Ohmic contacts. Similar size dots 57a partially (~5-10%) overlapped with the transparent Au Schottky diodes were deposited on the oxide layer between the openings for the Schottky contacts.

The wafer was then flipped over and Pt/Au dots 59 of the same size (~0.3 mm diameter) vertically aligned with Schottky contacts on the front of the wafer were deposited on the backside of the silicon wafer to form the IR-sensitive Schottky contacts. Ti/Au dots 57b were deposited to form Ohmic contacts.

Figure 6:
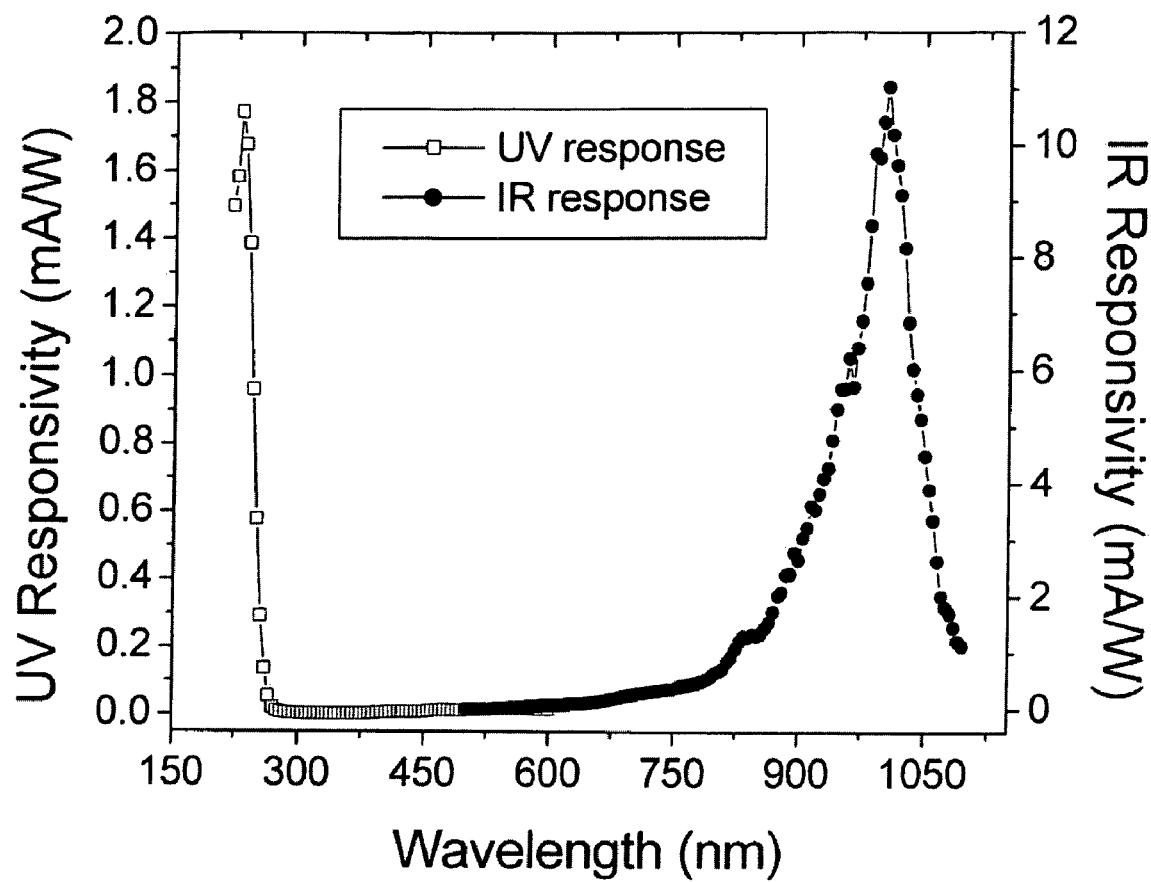
FIG. 6 shows the responsivity measured from the photodetector shown in FIG. 5

FIG. 6 shows responsivity of the solar-blind photodetector outlaid in FIG. 5. The UV cutoff wavelength is approximately around 265 nm, making the device solar-blind, since it is <280 nm. The UV response peaks at 230 nm with a responsivity of approximately 1.7 mA/W. The IR response peaks at 1000 nm with a responsivity of approximately 10 mA/W.

Measurements and simulations performed on several integrated photodiode structures laid out according to the described embodiment, indicate that employment of a silicon wafer with even a larger (100-200 μm) thickness is not sufficient by itself to provide for efficient rejection of the visible light by the integrated photodiode, if the UV-sensitive and IR-sensitive diodes are not vertically aligned. This is due to the defects in the real nitride layers causing leakage currents through the interfaces between the UV sensitive and the IR sensitive structure. It is believed to be necessary that the type of conductivity of the substrate be the same as that of the layers contacting the substrate. In this case the Schottky photodiodes on both sides of the integrated photodetector structure form built-in electrical fields of opposite direction resulting in the reduction of the leakage currents.

The effect of vertical alignment of the UV and IR photodiodes on the rejection of the visible light is confirmed by the following results.

Figure 7:
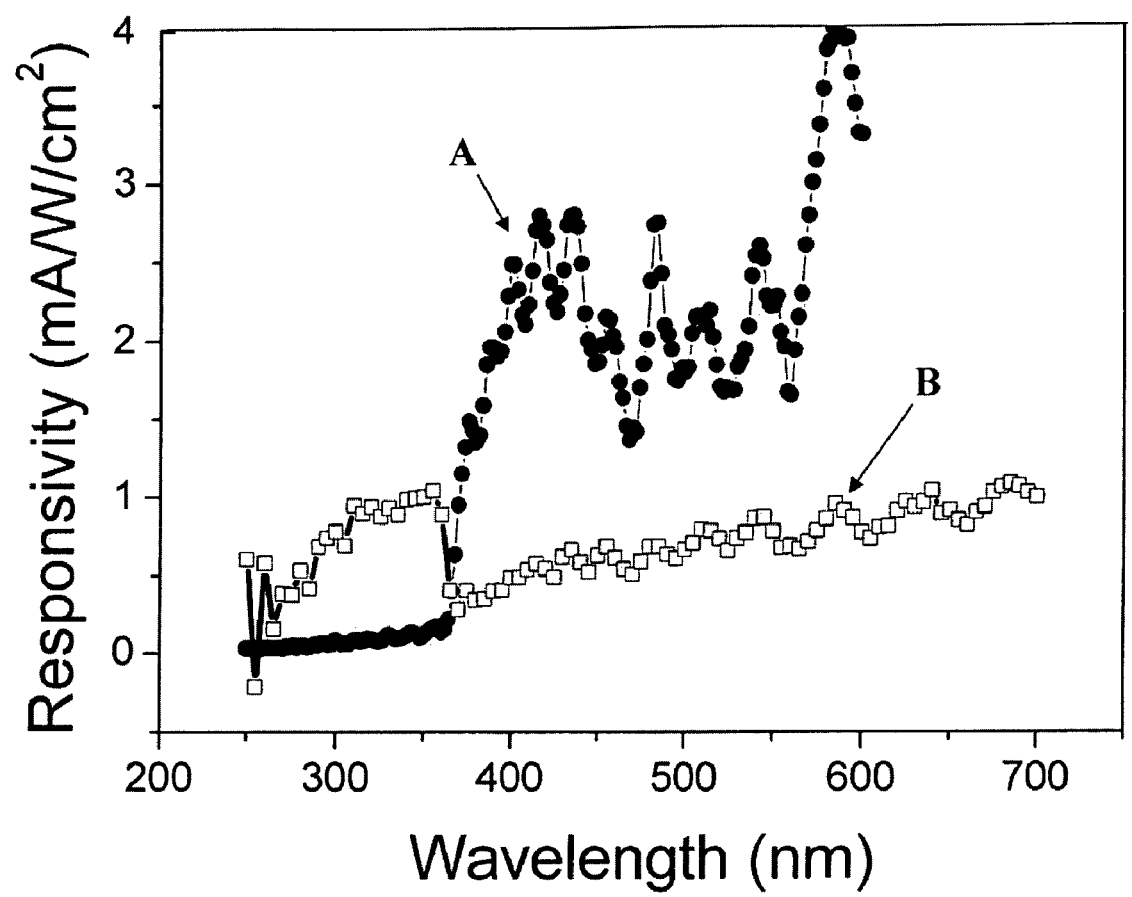
FIG. 7 illustrates photoresponses from the nitride-based Schottky photodiode: a) without an IR photodiode formed on the backside of the Si (curve A); b) with a vertically aligned IR photodiode formed on the backside of the Si.

Result 1: Schottky barrier based photodiodes were fabricated on the top of a 5000Å thick n-type GaN layer grown on a (111) n-type Si substrate with a thin (few hundred Å) undoped AlN buffer layer interspersed between them. The UV photodiode contact was fabricated by using a transparent tin oxide layer deposited by spray pyrolysis. Photolithography was used to pattern the tin oxide film into windows serving as photodetection areas for individual photodiodes and then Ti/Au contacts were deposited on the side of each tin oxide window by electron beam evaporation to provide for further electrical interconnections. The photoresponse from the nitride-based Schottky photodiode is shown in FIG. 7. Curve A indicates very little sensitivity in the UV range below 365 nm (this wavelength corresponds to the GaN bandgap) and a substantial sensitivity in the visible range. The sample was then reloaded into the e-beam deposition system for fabrication of the electrical contacts of the IR sensitive photodiode on the backside of the silicon. A 1500Å thick Au layer was deposited on the Si by e-beam evaporation through a stencil mask for the Schottky contact fabrication and a layer of Ti/Au (500Å/1000Å) was deposited for the Ohmic contact fabrication. The photoresponse was then measured again and the result (FIG. 7, curve B) shows a reduction in the visible range, while an increase of the response in the UV range is observed.

Figure 8:
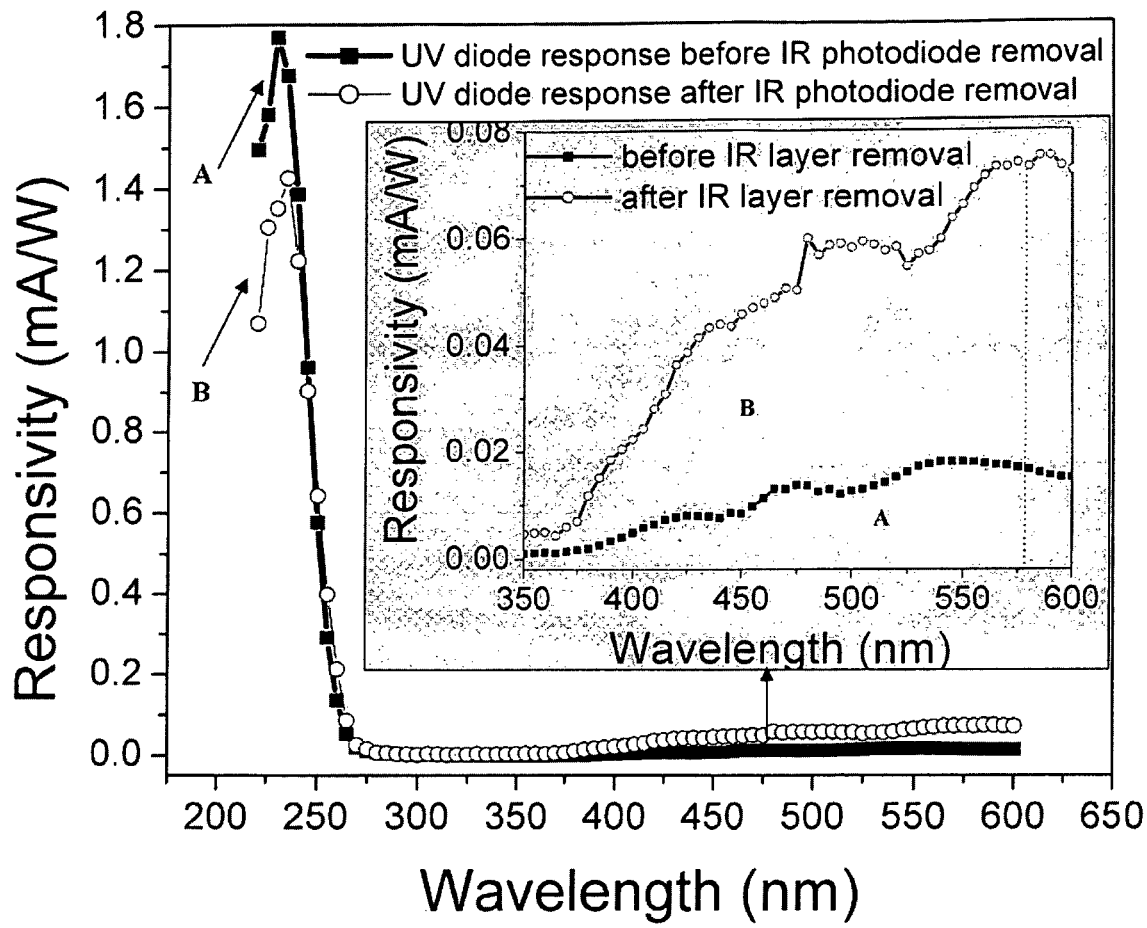
FIG. 8 is the UV photoresponse of the photodetector shown in FIG. 5: a) with vertically aligned UV sensitive and IR sensitive photodiode structures formed on the front side and the backside of the silicon substrate, respectively (curve A); b) with IR sensitive layer removed from the backside of the Si (curve B). The inset shows a more than 4-fold increase of the signal at 560 nm after the backside IR sensitive layer removal.

Result 2: The solar-blind photodiode structure was fabricated according to the layout shown in FIG. 5. Curve A in FIG. 8 is the UV photoresponse measured with both UV sensitive and IR sensitive photodiode structures formed on both sides of the silicon substrate. Curve B in FIG. 8 is the photoresponse of the UV sensitive structure after etching up the IR photodiode contacts in Aqua regia solution. The inset of the graph in FIG. 8 shows the responsivity of the UV sensitive structure in the range 350-600 nm. At least a 4 fold increase in visible light sensitivity at a wavelength of 560 nm is observed after the removal of the IR sensitive structure on the backside of silicon.

The effect of the vertical alignment of the UV and IR photodiodes is more pronounced when a reverse bias is applied to the diode structure formed on the backside of silicon. This feature was confirmed by the following result.

Figure 9:
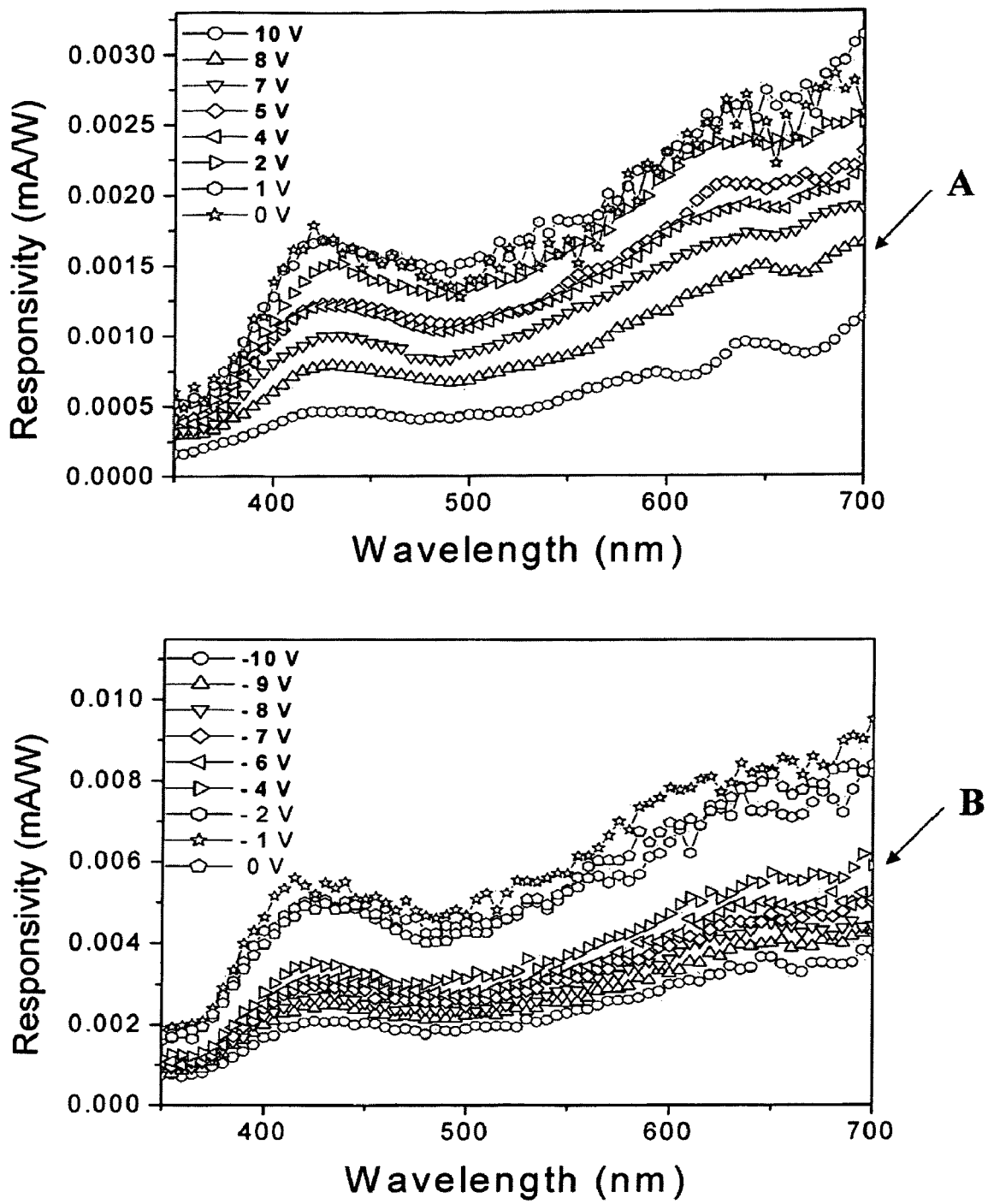
FIG. 9A shows the effect of a reverse bias applied to the contacts of the IR sensitive structure formed on the back of the silicon wafer on the responsivity to the visible light.
FIG. 9B shows the effect of a forward bias applied to the contacts of the IR sensitive structure formed on the back of the silicon wafer on the responsivity to the visible light.

Result 3: The previous 2 results show that reduction of the visible light detection by the UV diode can be achieved by fabrication of a Schottky barrier on the backside of the silicon wafer. The built-in voltage generated by such a barrier affects the collection of the photo generated carriers by changing the electrical field distribution in the structure. To show further enhancement of this effect, reverse (FIG. 9A) and forward (FIG. 9B) biases were applied to the contacts 59 and 57b (FIG. 5) of the IR sensitive structure formed on the back of the silicon wafer. An increase in the UV response and a substantial decrease in the visible response of the photodiode is observed with the increase of reverse bias potential. Application of forward biasing did not result in significant rejection of visible light, but reduced the overall responsivity of the device.

Similar device layouts can be used with a metal silicide layer formed on the backside of Si. The use of silicides takes advantage of silicon-based low cost technology and the abundant availability of silicon-based materials. Silicon detectors are widely used in a number of applications, however they lack optical integration due to the indirect nature of the silicon band gap. Improvements to Si have been achieved through integration with semiconducting silicides, such as: $ReSi_2$ ($E_g$=0.12 eV), $CrSi_2$ ($E_g$=0.3 eV) and $\beta$-FeSi ($E_g$=0.87 eV), of which $\beta$-$FeSi_2$ has a direct band gap energy that corresponds to a wavelength of 1.41 μM.

Figure 10:
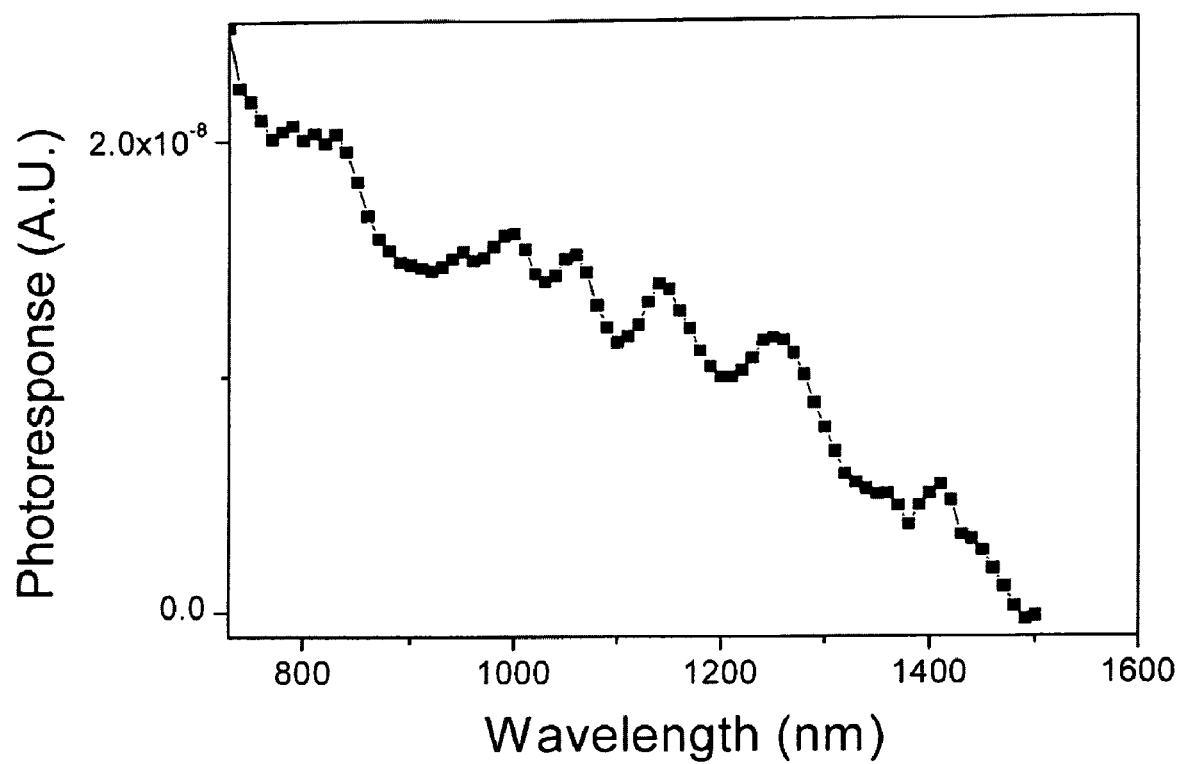
FIG. 10 shows the IR spectral response as a function of wavelength for a Pt-silicide Schottky barrier photodetector.

These PtSi/p-Si Schottky detectors have a barrier potential of 220 meV, which potentially offers a photodetection in the range from 3 μm to 5 μm. Titanium silicides have also been shown to extend the photoresponse into the 1450 nm of the IR region. Pt-silicide Shottky barrier photodiodes are formed by vacuum deposition and patterning of Pt on Si wafers followed by thermal annealing of the structure under high vacuum conditions. FIG. 10 shows the photoresponse from a Pt-silicide Schottky barrier diode, which extends up to 1450 nm (versus 1100 nm in the case of Si).

The same device layout employing a silicon substrate as a filter for the visible or solar radiation can be used when III nitride layer structures are grown on both sides of a Si wafer. In this case the top III nitride layer structure contains an AlN buffer layer and a GaN or AlGaN layer as in the previously described layouts. This structure is used to form the UV-sensitive part of the integrated photodetector. The bottom III nitride layer structure contains an AlN buffer layer and an InN or an InGaN layer and is used to form the IR-sensitive part of the integrated photodetector.

Since the nitride layers are deposited on both sides of the silicon substrate, which in the case of RF MBE is radiatively heated during deposition. It is necessary to protect the films on the first side of the wafer during deposition on the second side. This can be done in two steps. The first step will be to deposit the more thermally stable AlN and AlGaN layers for the UV detection side before the InGaN or InN-based detection side. The second step will be to coat the finished UV side with $SiO_2$ or $SiN_x$ to prevent decomposition of the AlGaN during vacuum heating.

Another embodiment can be based on cubic silicon carbide (β-SiC) layers grown on silicon wafers. In this case the UV-only sensitive structure can be formed on the SiC layer that has a band gap of around 3 eV and provides absorption of radiation at wavelengths in the range below ~413 nm. The IR-sensitive structure can be formed on the backside of the silicon substrate as in previous embodiments.

Another embodiment can employ a layer of germanium or one of the group II-VI materials grown on the backside of silicon. In this case the UV sensitive structure will be formed either on the III-nitride or SiC layer grown on the front side of Si, and the IR-sensitive structure will be formed on the germanium or group II-VI layer grown on the backside of Si.

Other embodiments can use substrates known to be compatible with III-nitride deposition such as ZnO. In the first two above embodiments the silicon wafer serves as a filter to block the visible or solar radiation.

Table 1 shows features and benefits for the single-chip integration of the photodetector with resolved sensitivities separately in UV and IR bands, resulting from application of each material described in the above embodiment.

TABLE I

Features and benefits of the disclosed chip provided by employment of different materials

| Material | Features and Benefits |
| --- | --- |
| Si substrates | Compatibility with conventional Si technology<br>Solar- or visible blindness<br>Si- and silicide-based detection of the IR radiation (up to ~1110 and ~1450 nm, respectively) |
| GaN | Visible-blind (down from ~365 nm) UV sensing<br>Simpler and higher quality growth |

TABLE I-continued

Features and benefits of the disclosed chip provided by employment of different materials

| Material | Features and Benefits |
| --- | --- |
| AlGaN | Solar-blind (down from ~280 nm) UV sensing |

What we claim is:

1. A monolithic single chip solid-state visible- or solar-blind photodetector for sensing of optical radiation separately in UV and IR bands, comprising:
   a silicon substrate having a thickness greater than about 10 micrometers such as to effectively block visible or solar radiation and having a front side exposed to the optical radiation and a back side;
   an active semiconductor layer on the front side of the silicon substrate having a sensitivity in the ultraviolet (UV) range only and a first pair of contacts to produce a first signal; and
   an active semiconductor layer on the back side of the silicon substrate having a sensitivity in the infrared (IR) range and a second pair of contacts vertically aligned with the first pair of contacts to produce a second signal.

2. The photodetector of claim 1 wherein the sensitivity to the optical radiation in the UV or IR bands and insensitivity to visible or solar radiation is provided by a diode junction fabricated on one of the active semiconductor layers.

3. The photodetector of claim 1 wherein the active layer providing absorption of the radiation in the UV range only is selected from the group III-V nitride compounds or SiC.

4. The photodetector of claim 1 wherein the active layer providing absorption of radiation in the IR range is selected from Si, germanium (Ge)-on-silicon, metal silicides, or group III-V nitride compounds.

5. The photodetector of claim 1 wherein the semiconductor layer having a sensitivity in the IR range has a sensitivity in a temperature range from about −60 to about 125° C.

6. The photodetector of claim 1 further comprising apparatus for applying a reverse bias to the second pair of contacts.

7. A method for increasing rejection of visible light by a IR sensitive layer on a back side of a monolithic single chip solid-state visible- or solar-blind photodetector for sensing of optical radiation separately in UV and IR bands, the photodetector comprising a substrate, a front side exposed to the optical radiation and the back side, an active semiconductor layer on the front side of the substrate having a sensitivity in the ultraviolet (UV) range only and a first pair of contacts to produce a first signal, and a second pair of contacts on the IR sensitive layer on the back side, the second pair of contacts being vertically aligned with the first pair of contacts to produce a second signal, comprising:
   applying a reverse bias to the contacts on the IR sensitive layer.

* * * * *